United States Patent [19]
Kodama

[11] Patent Number: 5,967,794
[45] Date of Patent: Oct. 19, 1999

[54] METHOD FOR FABRICATING A FIELD EFFECT TRANSISTOR HAVING ELEVATED SOURCE/DRAIN REGIONS

[75] Inventor: Noriyuki Kodama, Tokyo, Japan

[73] Assignee: NEC Corporation, Tokyo, Japan

[21] Appl. No.: 08/903,146

[22] Filed: Jul. 30, 1997

[30] Foreign Application Priority Data

Jul. 31, 1996 [JP] Japan ................................. 8-202360

[51] Int. Cl.$^6$ ................................................. H01L 21/336
[52] U.S. Cl. ............................................. 438/300; 438/301
[58] Field of Search ................................... 438/300, 301, 438/302

[56] References Cited

U.S. PATENT DOCUMENTS

| | | | |
|---|---|---|---|
| 4,705,591 | 11/1987 | Carle et al. | 117/15 |
| 4,755,865 | 7/1988 | Wilson et al. | 257/754 |
| 4,766,477 | 8/1988 | Nakagawa et al. | 257/64 |
| 4,772,927 | 9/1988 | Saito et al. | 257/66 |
| 4,968,384 | 11/1990 | Asano | 438/96 |
| 4,998,150 | 3/1991 | Rodder et al. | 257/288 |
| 5,463,978 | 11/1995 | Larkin et al. | 117/89 |
| 5,683,934 | 11/1997 | Candelaria | 438/155 |

FOREIGN PATENT DOCUMENTS 2-222153   9/1990   Japan .

OTHER PUBLICATIONS

Ban, I.; Ozturk, M. C.; and Demirlioglu, E.K. "Suppression of Oxidation Enhanced Boron Diffusion in Silicon by Carbon Implantattion and Characterization of MOSFET's with Carbon Implanted Channels." IEEE Trans. Electron Dev., vol. 44, No. 9, pp. 1544–1551, Sep. 1997.

*Primary Examiner*—Charles Bowers
*Assistant Examiner*—Craig Thompson
*Attorney, Agent, or Firm*—Young & Thompson

[57] ABSTRACT

A method of making a semiconductor device with a shallow (on the order of 50 nm) PN junction depth includes the steps of forming, on a region of a semiconductor substrate in which an impurity diffusion region having the shallow PN junction depth is to be formed, a selectively grown silicon layer (raised layer) containing a substance such as carbon which easily combines with point defects in the semiconductor substrate or a substance such as nitrogen which prevents an impurity providing an electrical conductivity from diffusing, ion-implanting an impurity of one conductivity type into the selectively grown silicon layer, and forming the diffusion region by activating the implanted impurity of one conductivity type and diffusing the impurity of one conductivity type into the semiconductor substrate, by means of heat treatment.

21 Claims, 5 Drawing Sheets

METHOD FOR FABRICATING A FIELD EFFECT TRANSISTOR HAVING ELEVATED SOURCE/DRAIN REGIONS

BACKGROUND OF THE INVENTION

1. Field of the Invention

The present invention relates to a fabrication method of a semiconductor device formed on a semiconductor substrate and more particularly to a MOS type field effect transistor (FET) having its source/drain regions raised higher than a surface of the semiconductor substrate.

2. Related Art

Down-sizing of a MOS type FET which is a main constitutional element of a high integration density semiconductor integrated circuit is being enhanced with the increase in integration density. It is said that, with a gate length of such MOS type FET being in the order of 0.1 μm, junction depth of a source/drain difflusion layer should be made in the order of 50 nm. In such a down-sized MOS type FET, problems related to the short-channel effects and/or the punch-through are becoming serious.

A source/drain region having a small junction depth is usually formed by ion implantation. The simplest method of forming a shallow diffusion layer by ion implantation is to reduce the acceleration energy of ions to thereby shorten the penetration depth (projection range) of ions during ion implantation. However, when the acceleration energy is reduced, the amount of ion current during ion implantation is reduced, resulting in a problem that the method becomes unsuitable for mass-production.

Further, it may be considered to restrict diffusion of impurity by lowering a temperature of thermal treatment for activation of implanted ions. However, it is well known that boron which is a P-type impurity tends to be recombined with point defects in a silicon substrate resulting in defect enhanced diffusion. Therefore, even when the thermal treatment temperature is reduced, it is impossible to suppress the diffusion depth to a small value.

In order to make up for the problem of defect enhanced diffusion, a rapid thermal annealing (RTA) for performing heat treatment within a short time has been proposed. However, it is known that, even with RTA, a practical junction depth of the diffusion layer is 80 to 100 nm, which is still larger than 50 nm at which the influences of the short-channel effects and the punch-through can be suppressed. Further, even with RTA, the diffusion of boron impurities is predominantly by the aforementioned defect enhanced diffusion. It has been known that the defect enhanced diffusion is influenced by the ramp-up rate during the rapid heating process. Thus, there is a further problem that precise control of the junction depth among different wafers is difficult due to the variation in the ramp up rate from wafer to wafer.

Further, in the conventional ion implantation, when the junction depth of a diffusion layer is made small, there may be a problem that resistance of the diffusion layer and contact resistance to a wiring are increased.

In order to solve these problems, a fabrication method of a MOS type FET having an elevated (or raised) diffusion layer has been proposed in Japanese Laid-open Patent Application No. H2-222153, in which a silicon layer is selectively formed on a diffusion layer of a silicon substrate. The proposed fabrication method of a MOS type FET having a raised diffusion layer structure will be described with reference to FIG. 4(a) to FIG. 4(c).

First, as shown in FIG. 4(a), an element separating oxide film 2 is formed on a silicon substrate 1A by partial oxidation of a surface of the substrate. A well region 1B is formed by introducing an impurity into the substrate 1A up to several microns deep by ion implantation and activating the impurity ion by the rapid thermal annealing RTA) at about 850° C. Then, a gate oxide film 3 having thickness in the order of 5 nm is formed on a surface of the well region 1B and a boron containing polysilicon layer 200 nm thick is deposited on the gate oxide film 3. The polysilicon layer later forms a gate electrode. Then, an oxide film 50 nm thick is deposited thereon and a gate electrode 4 is formed by patterning the polysilicon layer with using the oxide film as a mask. Thereafter, a nitride film 20 nm thick is deposited on the well region and a sidewall 5 is formed by removing the nitride film other than that adjacent a gate sidewall portion by plasma etching.

Then, after a native oxide film on a portion of the well region in which a source/drain region is to be formed is removed by processing the wafer in hydrofluoric acid vapor, the wafer is set in a low pressure CVD device without exposing it to atmosphere and an epitaxial silicon layer 6A is selectively grown on only the surface of the well region in which silicon is exposed and the source/drain region is to be formed (FIG. 4(b). This selective epitaxy is performed at about 800° C. by flowing a gas mixture of dichlorosilane ($SiCl_2H_2$) as a material gas, hydrogen ($H_2$) as a carrier gas with hydrogen chloride gas. Thus, it is possible to grow the silicon layer 6A on only the silicon surface without formation of silicon film on the silicon oxide film. During the selective epitaxial growth of the silicon layer, a formation of silicon layer on a surface of the gate electrode 4 in which polysilicon is exposed can be prevented by covering the surface of the gate electrode 4 with an oxide film 6C. The oxide film 6C is removed thereafter. Depending on the selective growing condition, there may be a case where a silicon layer is not grown in the vicinity of the sidewall 5 and a facet 7 which prevents the selectively grown silicon layer from contacting with the sidewall 5 is formed. In such a case, in order to bury the facet 7, a second sidewall 8 of such materials as silicon nitride is formed as shown in FIG. 4(b).

Then, in order to prevent contamination of the wafer due to ion implantation, an oxide film about 5 nm thick (not shown) is formed on the surface of the gate electrode 4 and a surface of an ion implantation region which is the surface of the silicon layer 6A by thermal oxidation. Thereafter, impurity ions are introduced into the region in which the source/drain is to be formed, by ion implantation. The ion implantation is performed using $BF_2$ with injection energy of 10 to 20 keV when the conductivity type of the source/drain region is to be P type, or by using As (arsenic) with injection energy of 40 to 60 keV when the conductivity type thereof is to be N type. The impurity implanted is activated by rapid thermal annealing (RTA) at a temperature in the order of 1,000° C. and diffuses throughout the gate electrode 4 and into the well region 1B in which the source/drain region is to be formed, resulting in source and drain regions 9.

Then, after the oxide film (not shown) for preventing the contamination due to ion implantation is removed, a titanium (Ti) layer 40 nm thick is formed by sputtering and a titanium silicide ($TiSi_2$) film having a relatively high resistance is formed on the silicon layer 6 and the gate electrode 4 by RTA at about 700° C. The titanium layer on the oxide film is not silicified during the heat treatment by rapid thermal annealing (RTA) and remains as it is. After titanium is selectively etched away leaving only titanium silicide, the high resistance titanium silicide film (TiSi$_2$) is converted into low resistance titanium silicide films 10A and 10B through phase transfer by RTA at about 850° C.

Further, an interlayer film 11 of such insulating material as silicon oxide is deposited on the wafer by a low temperature growth method such as plasma CVD, contact holes 12 are opened in the interlayer film 11 and an aluminum wiring 13 is formed through the contact holes, resulting in a MOS type FET as shown in FIG. 4(*c*).

In the case of a MOS type FET, the junction depth Xj of source/drain diffusion regions 9, which influences the electric characteristics of the transistor, is measured from a surface of a silicon substrate thereof. In a case of MOS type FET having the raised source/drain structure, ion implantation is performed from the surface of the raised layer 6A of the source/drain region, so that it is possible to reduce the junction depth Xj by an amount corresponding to the thickness of the raised layer 6A. Therefore, the raised source/drain structure is suitable for obtaining a MOS type FET having small junction depth.

In more detail, when an RTA condition under which a conventional MOS type FET having no raised structure and having junction depth Xj of 100 nm can be formed is applied to a MOS type FET having 60 nm-raised structure, the junction depth Xj can be made in the order of 40 nm. Therefore, it is possible to easily obtain a down-sized MOS type FET having junction depth Xj of 0.1 $\mu$m. Another merit of this raised structure resides in that sheet resistance of the source/drain region and contact resistance can be reduced by an amount corresponding to the extra thickness of the raised layer.

On the other hand, as mentioned previously, it is impossible to prevent the influence of defect enhanced diffusion of boron and to prevent a wafer to wafer variation in diffusion depth, even when rapid thermal annealing is used. In order to prevent the influence of the defect enhanced diffusion of boron and to prevent a variation of diffusion depth, a simultaneous injection of boron and carbon and a subsequent heat treatment have been studied. Since carbon has a stronger tendency to combine with excess point defects in a silicon substrate than boron, it is possible to reduce combination of boron with point defects in silicon to thereby reduce defect enhanced diffusion of boron.

In the case where carbon is implanted simultaneously with implantation of boron, there is a problem that junction leakage increases due to residual defects formed during carbon implantation since carbon distribution has an edge close to a PN junction.

Moreover, surface concentration of carbon needs to be in the order of $10^{19}$ atoms/cm$^3$. In such a case, a concentration distribution 26B of implanted boron is controlled to be shallower than a concentration distribution 26C of implanted carbon, as shown in FIG. 5. Thereafter, boron is diffused by heat treatment, resulting in a source/drain region. Since, in such a case, a precise control of concentration distribution of carbon is difficult and defect enhanced diffusion of boron extends outside the concentration distribution of carbon when the latter is narrow, there is a problem that a variation of junction depth Xj occurs and it is impossible to make the junction depth Xj sufficiently small.

SUMMARY OF THE INVENTION

An object of the present invention is to provide an improved fabrication method of a semiconductor device including a MOS type FET having a raised source/drain region.

According to the present invention, in order to achieve the above mentioned object, a fabrication method of a semiconductor device comprises the steps of selectively growing on an impurity diffused region such as a source/drain region of a semiconductor substrate, a "raised" semiconductor layer containing a substance such as carbon which tends to combine with point defects in the semiconductor substrate and/or a substance such as nitrogen which prevents a dopant impurity from diffusing, and then implanting conductivity determining dopant impurity ions into this raised layer. The source/drain region is then formed by activating the dopant impurity and diffusing it into the semiconductor substrate by means of heat treatment.

According to the present invention, since the substance such as carbon which tends to combine with point defects in the semiconductor substrate and/or the substance such as nitrogen which prevents an impurity providing electrical conductivity from diffusing is introduced into the selectively grown, raised layer not by ion-implantation but during the growth of the raised layer, there is no residual defects formed. Further, since distributions of the substance such as carbon and the substance such as nitrogen are precisely controlled by the selective growth thereof, it is possible to reduce the possibility of junction leakage and the variation of wafer to wafer junction depth.

BRIEF DESCRIPTION OF THE DRAWINGS

The above and other objects, advantages and features of the present invention will be more apparent from the following description taken in conjunction with the accompanying drawings in which:

FIG. 2(*b*) shows an impurity distribution in the raised layer portion after an impurity is activated and diffused;

FIG. 3(*b*) shows an impurity distribution in the raised layer portion after an impurity is activated and diffused;

DETAILED DESCRIPTION OF THE PREFERRED EMBODIMENTS

Figure 4A:
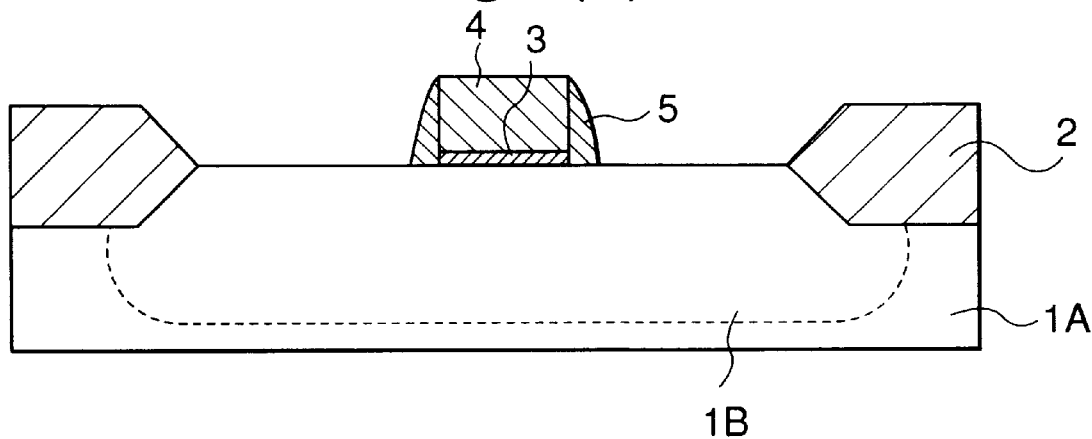
FIG. 4(*a*) to FIG. 4(*c*) are cross sections showing fabrication steps of a conventional transistor having a raised layer.
Figure 4B:
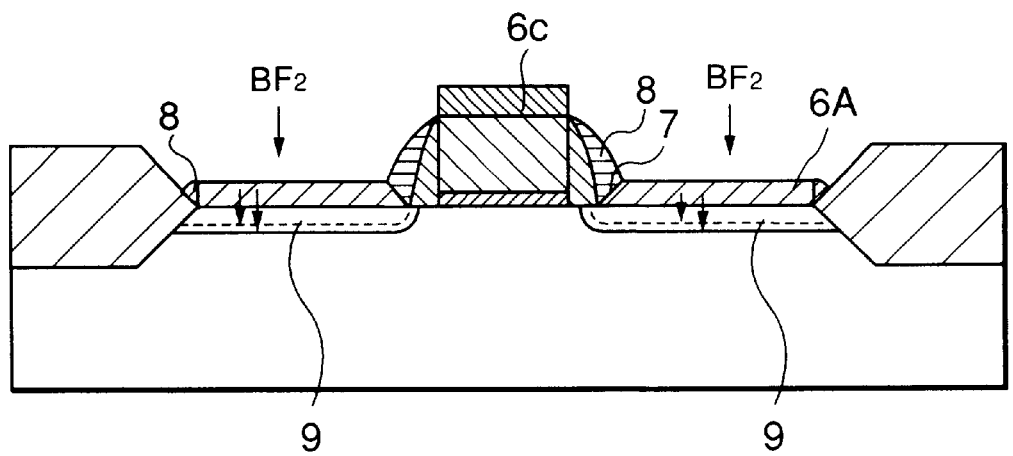
Figure 4C:
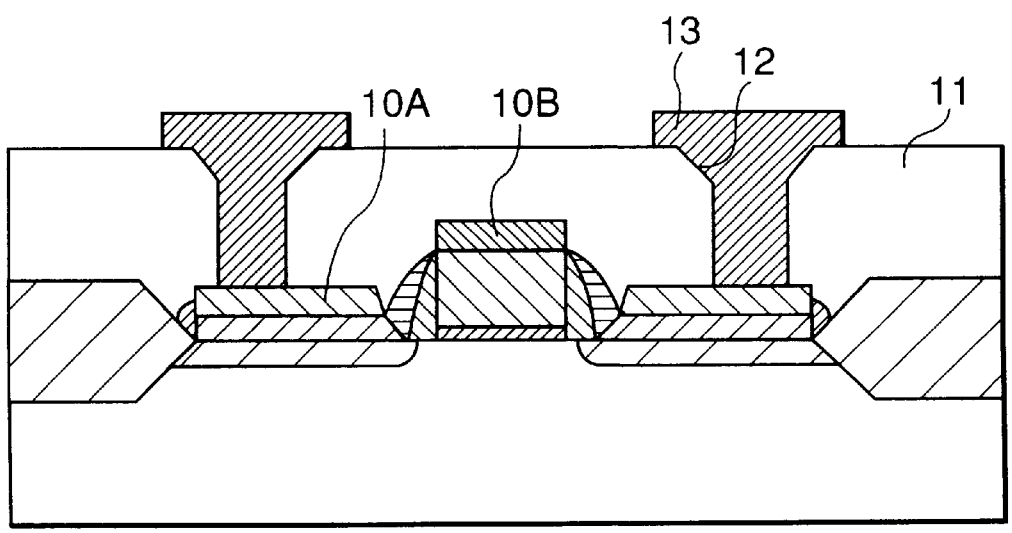
Figure 5:
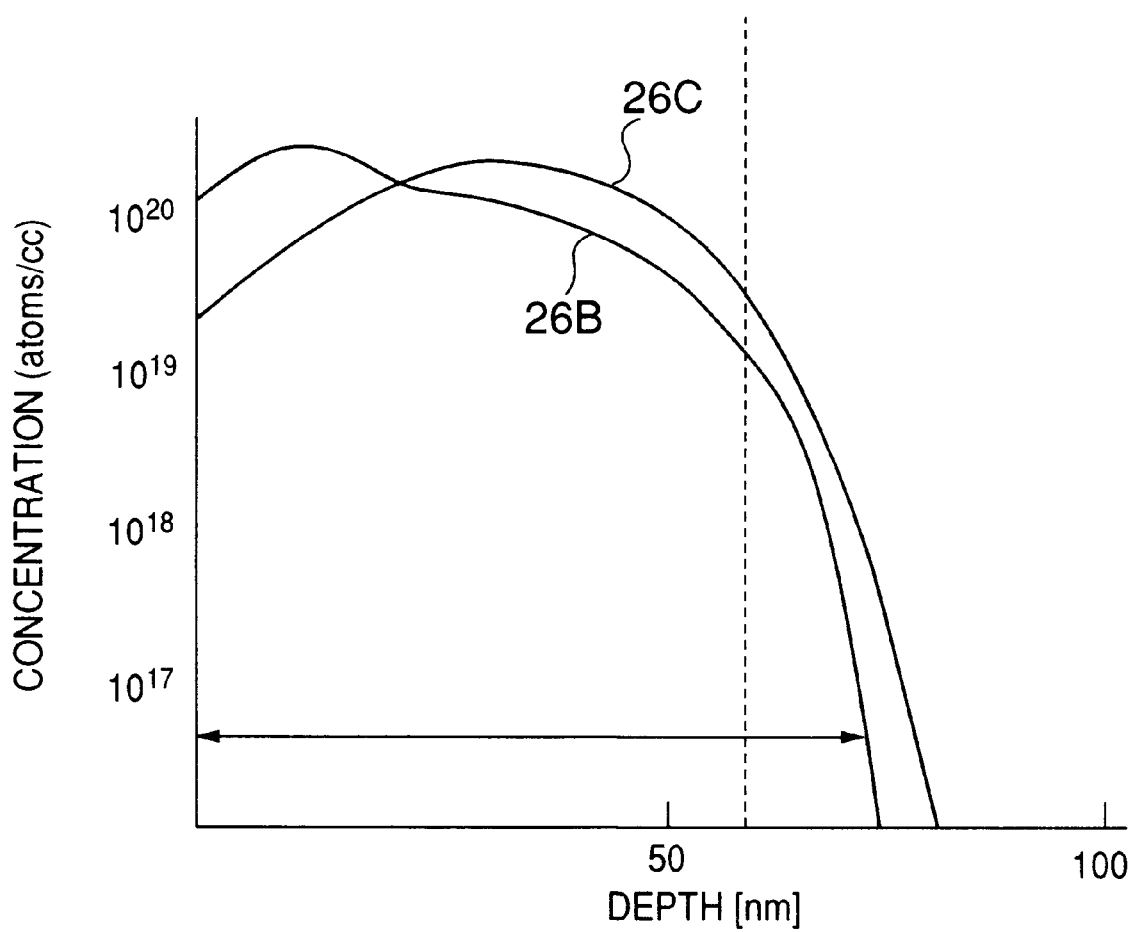
FIG. 5 is a graph showing distributions of carbon and dopant impurity according to a conventional method for introducing carbon into an impurity ion implanted region.

A first embodiment of the present invention is shown in FIG. 1 (*a*) to FIG. 1(*c*). FIG. 1(*a*) and FIG. 1(*c*) are the same as FIGS. 4(*a*) and 4(*c*) showing the conventional method, respectively.

First, as shown in FIG. 1(*a*), an element separating oxide film 2 is formed on a silicon substrate 1A by selective oxidation of a surface of the substrate 1A except an element forming region thereof. Thereafter, a well region 1B is formed by activating the impurity ions. Then, a gate oxide film 3 having thickness of in the order of 5 nm is formed on a surface of the well region 1B by thermal oxidation and a boron containing polysilicon layer about 200 nm thick is deposited on the gate oxide film 3. Then, a gate electrode 4 is formed by selectively removing the polysilicon layer except that on a region in which the gate electrode is to be formed. Further, a nitride film is deposited on the whole surface of the wafer and a sidewall 5 is formed by selectively removing the nitride film other than that in a gate sidewall portion by dry etching.

Figure 1A:
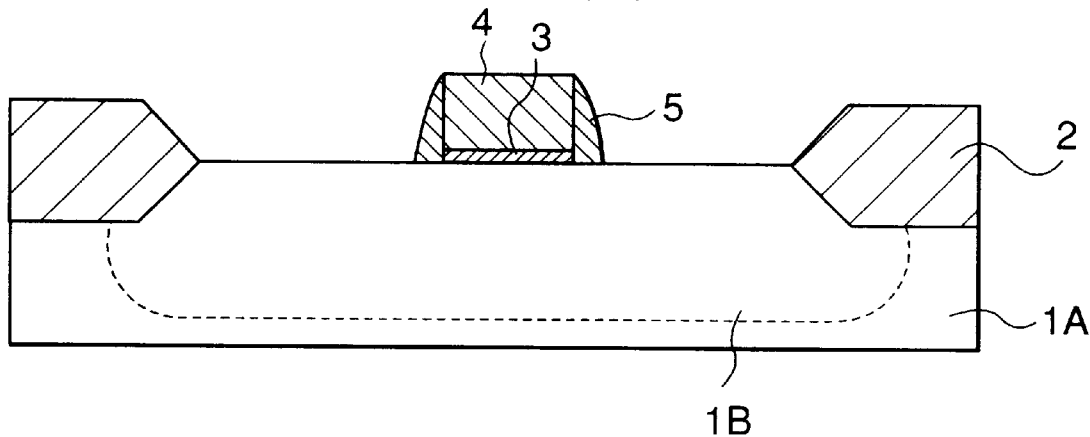
FIG. 1(*a*) to FIG. 1(*c*) are cross sections showing fabrication steps according to an embodiment of the present invention.
Figure 1B:
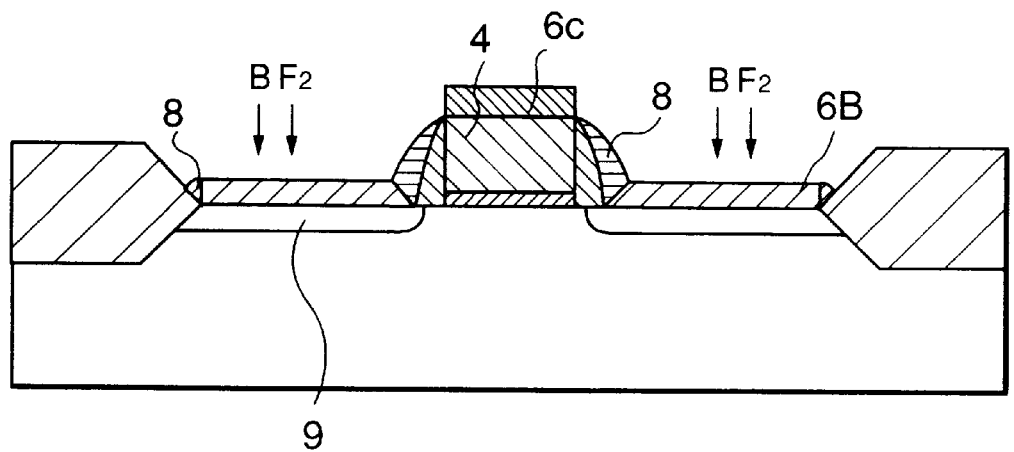
Figure 2A:
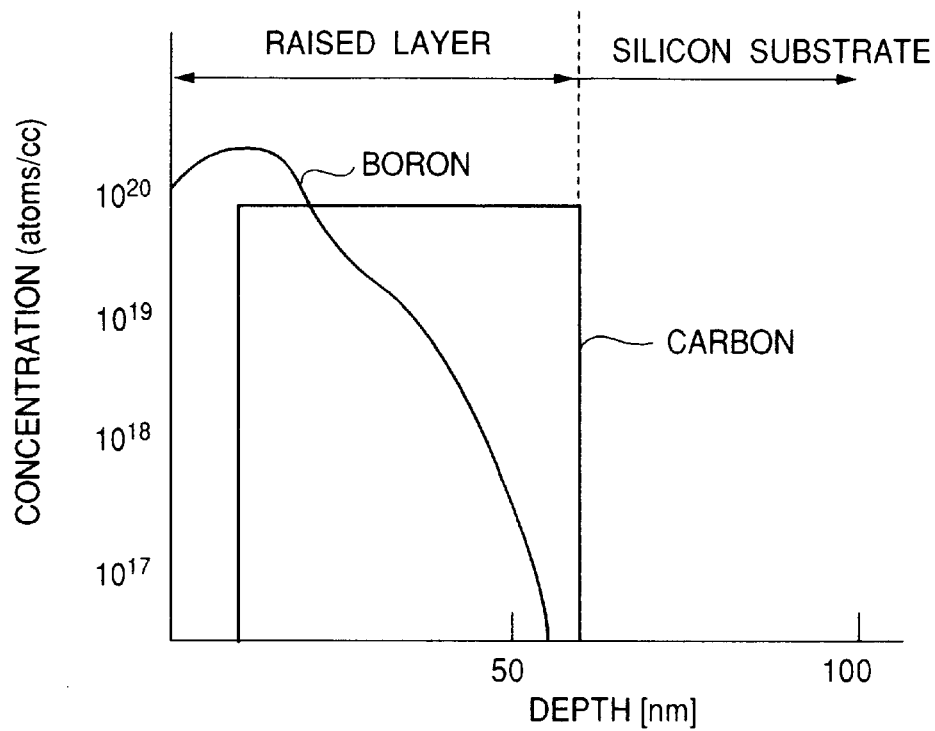
FIG. 2(*a*) shows an impurity distribution in a raised layer portion according to a first embodiment of the present invention.

Then, as shown in FIG. 1(b), after a native oxide film is removed by processing the wafer in hydrofluoric acid vapor, the wafer is set in a low pressure CVD (LPCVD) apparatus without exposing it to atmosphere and a silicon epitaxial layer 60 nm thick is selectively formed on the exposed surface of the semiconductor substrate as a raised layer 6B on the region in which a source/drain region is to be formed. The selective epitaxial step is performed in a mixture gas atmosphere of dichlorosilane as a material gas, hydrogen as a carrier gas, hydrogen chloride gas for attaining a selective growth and acetylene for introducing carbon into the raised layer 6B. With this selective growth of the silicon layer containing carbon, the carbon concentration distribution in the raised layer becomes uniform as shown in FIG. 2(a). As described with reference to the conventional method, there may be a portion, that is, a facet, in a border region between the selectively grown silicon layer and the sidewall 5 in which the selectively grown silicon layer does not intimately contact with the sidewall 5. In order to bury this facet, a second sidewall 8 is formed by depositing an oxide film 20 nm thick and selectively removing the deposited oxide film except that in the side portion of the sidewall 5 by dry etching.

Figure 2B:
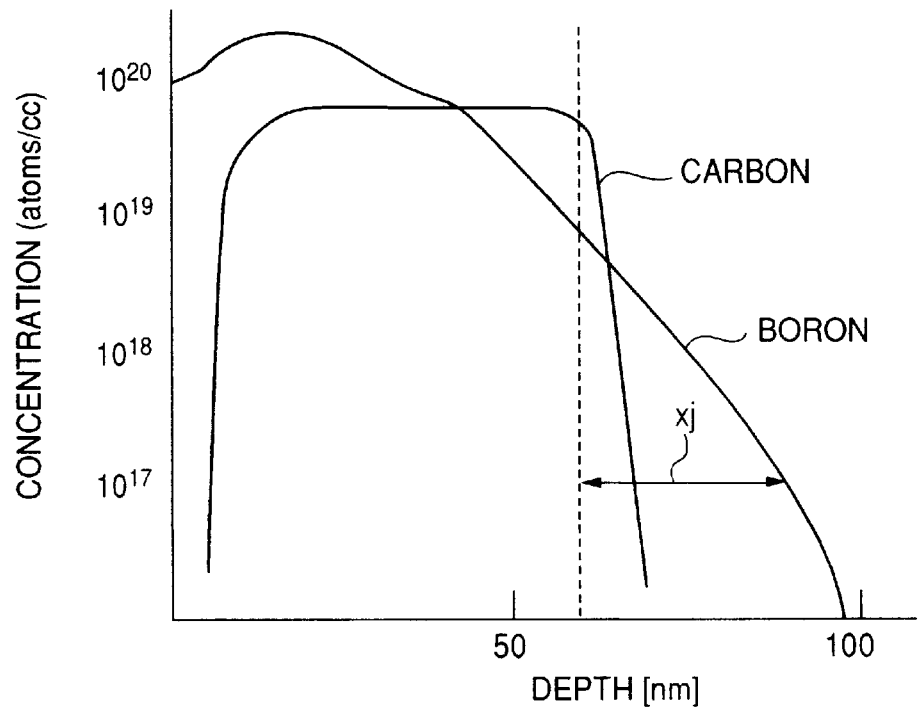
Figure 3A:
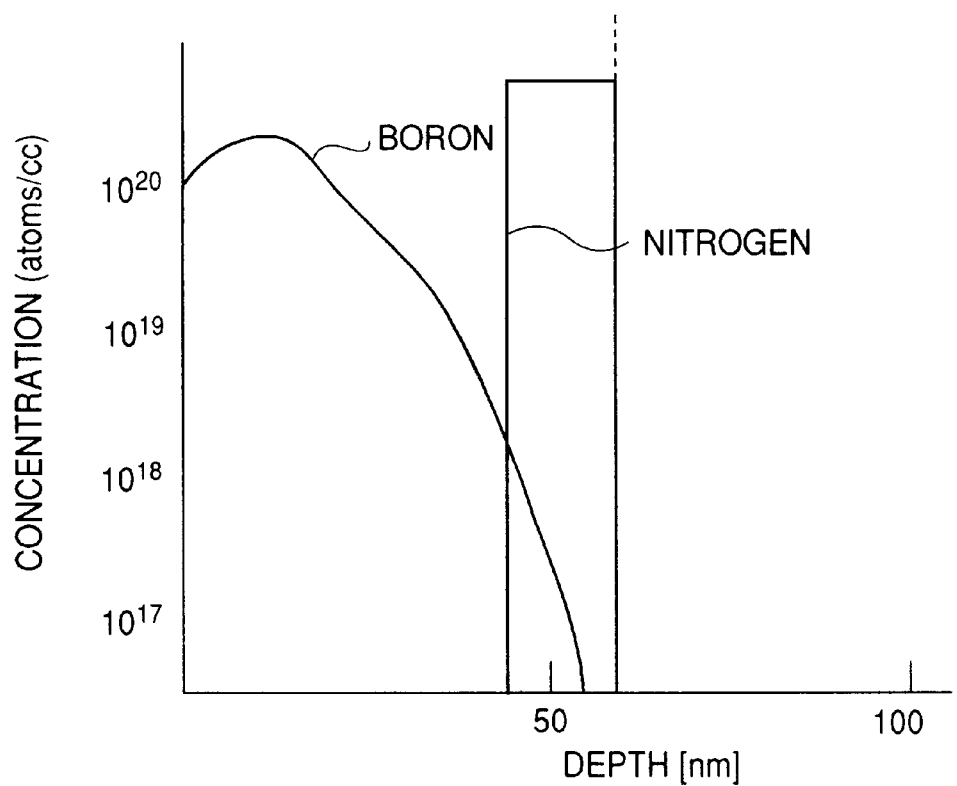
FIG. 3(*a*) shows an impurity distribution in a raised layer portion according to a second embodiment of the present invention.
Figure 3B:
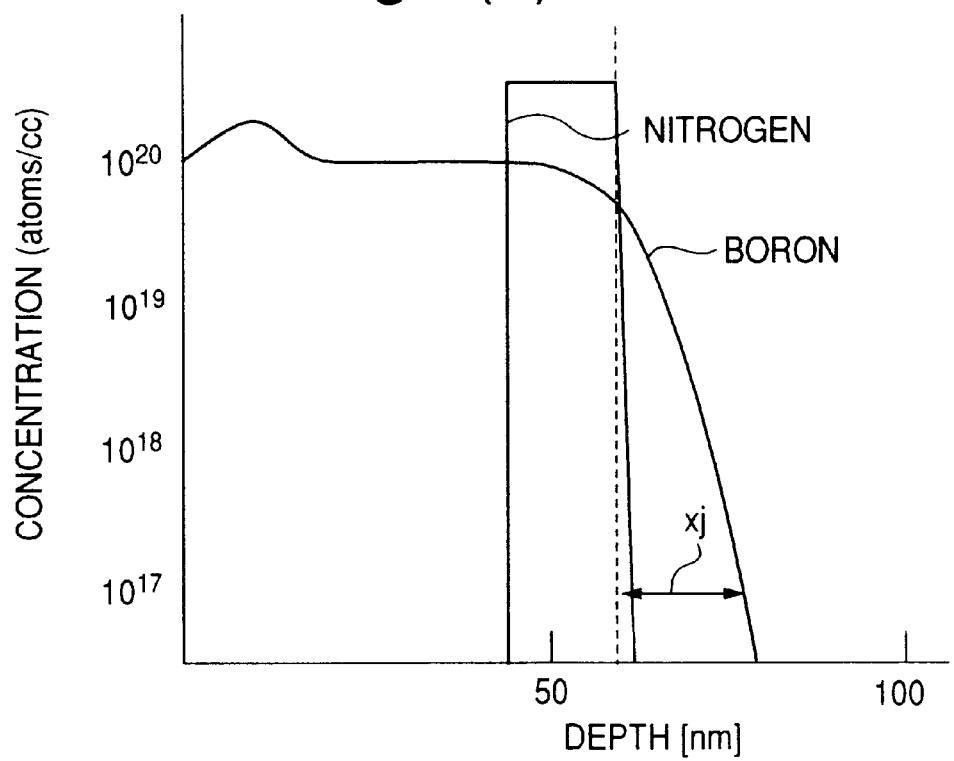

Then, in order to obtain the distribution of boron concentration within the raised layer 6B as shown in FIG. 2(a), $BF_2$ is ion implanted in the raised layer 6B with injection energy of 10 to 20 keV and with a dose of $2 \times 10^{15}$ atoms/cm$^3$. Then, the implanted boron is activated and diffused into the underlying substrate by annealing the wafer in nitrogen atmosphere at 800° C. for about 10 minutes in a heat-treatment furnace, resulting in a source/drain region 9 having the raised layer 6B with a concentration distribution such as shown in FIG. 2(b).

Figure 1C:
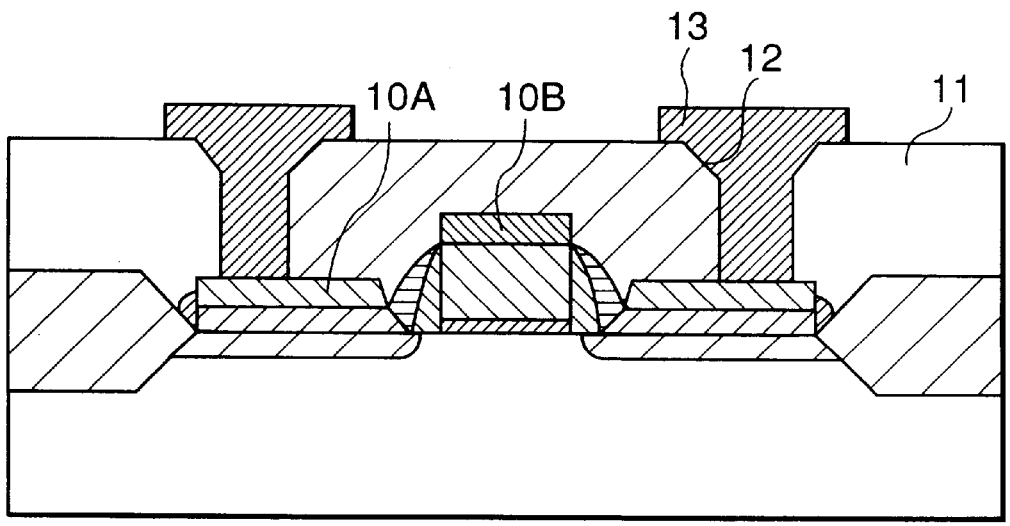

Thereafter, a semiconductor device including a MOS type FET such as shown in FIG. 1(c) is obtained by forming titanium silicide layers 10A and 10B, depositing an interlayer oxide film 11 on the wafer, opening contact holes 12 in the interlayer film 11 and forming an aluminum wiring 13 through the contact holes, as in the conventional method.

According to this embodiment in which the raised layer 6B formed of selectively grown silicon contains carbon mixed therein from acetylene contained in the epitaxial reaction gas of the selective growth of the raised layer, carbon distributes uniformly in only the raised layer 6B. Therefore, carbon never reaches the PN junction formed in the silicon substrate 1A, so that there is no leak current due to crystal defects of the PN junction caused by carbon. This feature of the present invention compares favorably with the conventional ion implantation since the distribution of carbon introduced according to the conventional method and extends even into an interior of the silicon substrate 1A, causing crystal defects at the PN junction to thereby produce leak current. Further, although, in the conventional method, crystal defects of silicon are produced during ion implantation of carbon, there is no case of production of crystal defects in the present invention since carbon is not ion implanted.

As mentioned previously, carbon tends to be combined with point defects in silicon. When ion-implanted boron distributes in the raised layer 6B, there is no combination of boron with point defects of silicon during boron ion implantation, since the point defects therein have already been consumed by carbon. Further, even when boron is diffused into the silicon substrate 1A by the subsequent heat treatment for activation of boron, there is no defect enhanced diffusion of boron and it is possible to precisely control the junction depth.

In a case where carbon is exposed at the surface of the raised layer 6B, there may be an outward diffusion of carbon and/or the wafer may be contaminated with carbon in the washing step. In the present invention, in order to solve such a problem, carbon introduction into the raised layer 6B is restricted such that carbon is not introduced into an upper portion of the raised layer 6B, which is about 10 to 20 nm thick measured from the surface of the raised layer 6B, as shown by the carbon concentration distribution in FIG. 2(a). This may be attained by controling the flow of acetylene during epitaxial growth of the raised layer. With such a scheme, there is another effect obtained that the phenomenon of carbon related restriction of siliciding reaction in the subsequent electrode forming step is prevented.

Now, a second embodiment of the present invention will be described.

The second embodiment differs from the first embodiment shown in FIG. 1(a) to FIG. 1(c) in a reaction gas used in the selective growth of the raised layer 6B. That is, in the second embodiment, the reaction gas is a mixture of dichlorosilane as the material gas, nitrogen as the carrier gas, hydrochloride as the gas for providing the selective growth and nitrous oxide ($N_2O$) as a gas for introducing nitrogen as the substance which is easily combined with point defects of silicon. After the sidewall 5 shown in FIG. 1(a) is formed, the native oxide film on the surface is removed by hydrofluoric acid vapor. Then, a silicon epitaxial layer 60 nm thick is selectively formed on the exposed surface of the silicon substrate by LPCVD, resulting in the raised layer 6B on the region in which the source/drain region is to be formed. Distribution of nitrogen in this case is controlled such that the concentration thereof in a position about 10 to 20 nm deep from the surface of the raised layer becomes about $5 \times 10^{20}$/cm$^3$. That is, during an initial 10 to 20 nm growing stage of the selective silicon growth, nitrous oxide ($N_2O$) is added to the reaction gas and, during the subsequent stage, no nitrous oxide is added. Thereafter, boron is implanted by ion implantation of $BF_2$. When this ion implantation is performed with acceleration energy of 20 keV, boron distributes within the distribution area of nitrogen. Although boron is easily diffused up to a depth of 40 to 50 nm at which nitrogen appears by the subsequent heat treatment for activation, a further diffusion thereof is prevented by the existence of nitrogen. Therefore, the diffusion distance of boron can be controlled by the position in the raised layer at which nitrogen exists and thus it is possible to form a transistor having a stable junction depth.

Although, in the second embodiment, nitrogen is distributed in the raised layer as the substance for preventing diffusion of impurity which provides an electrical conductivity, other substance such as oxygen can be used instead of nitrogen. Further, it is possible to introduce a substance such as carbon which is easily combined with point defects in the semiconductor substrate in addition to the substance for preventing diffusion of impurity which provides an electrical conductivity, during the formation of the raised layer.

As described in detail, according to the present invention, it is possible to restrict the defect enhanced diffusion of the impurity which provides electrical conductivity by mixing the substance such as carbon which is easily combined with point defects of silicon during the formation of the raised layer on the source/drain region and, therefore, it is possible to obtain a transistor having stable junction depth. Further, it is possible to obtain a transistor having a small junction depth by mixing a substance such as nitrogen or oxygen which prevents the impurity which provides electrical conductivity from diffusing, during the formation of the raised layer on the source/drain region.

While the present invention has been described in connection with certain preferred embodiments, it is to be understood that the subject matter encompassed by way of the present invention is not to be limited to those specific embodiments. On the contrary it is intended for the subject matter of the invention to include all alternatives, modifications and equivalents as can be included within the spirit and scope of the following claims.

What is claimed is:

1. A method of fabricating a semiconductor device, said method comprising the steps of:
    selectively forming on a region of a semiconductor substrate in which an impurity diffusion region of one conductivity type is to be formed, an epitaxial silicon layer doped with at least one of a substance capable of combining with point defects in said semiconductor substrate and a substance for preventing an impurity providing an electrical conductivity from diffusing;
    ion-implanting an impurity of one conductivity type into said selectively grown silicon layer; and
    forming said impurity diffusion region of said one conductivity type by activating said impurity of said one conductivity type and diffusing said impurity of one conductivity type into said semiconductor substrate by means of a heat treatment.

2. A method of fabricating a semiconductor device as claimed in claim 1, wherein a surface portion of said epitaxial silicon layer is not intentionally doped with said substance capable of being combined with point defects in said semiconductor substrate and said substance for preventing an impurity providing an electrical conductivity from diffusing.

3. A method of fabricating a semiconductor device as claimed in claim 1, wherein said substance capable of being combined with point defects in said semiconductor substrate is carbon and said substance for preventing an impurity providing an electrical conductivity from diffusing is selected from a group consisting of nitrogen and oxygen.

4. A method of fabricating a semiconductor device as claimed in claim 2, wherein said substance capable of being combined with point defects in said semiconductor substrate is carbon and said substance for preventing an impurity providing an electrical conductivity from diffusing is selected from a group consisting of nitrogen and oxygen.

5. A method of fabricating a semiconductor device as claimed in claim 3, wherein said epitaxial silicon layer is formed by using a mixture gas of a reaction gas for selectively growing silicon, and acetylene.

6. A method of fabricating a semiconductor device as claimed in claim 4, wherein said epitaxial silicon layer is formed by using a mixture gas of a reaction gas for selectively growing silicon, and acetylene.

7. A method of fabricating a semiconductor device as claimed in claim 3, wherein said epitaxial silicon layer is formed by using a mixture gas of a reaction gas for selectively growing silicon, and nitrous oxide.

8. A method of fabricating a semiconductor device as claimed in claim 4, wherein said epitaxial silicon layer is formed by using a mixture gas of a reaction gas for selectively growing silicon, and nitrous oxide.

9. A method of fabricating a semiconductor device having a raised layer, comprising the steps of:
    forming a gate insulating film on a predetermined region in one major surface of a semiconductor substrate and a gate electrode on said gate insulating film;
    forming a sidewall of an insulating film on a side surface of said gate electrode;
    selectively growing a semiconductor layer doped with at least one of a substance capable of being combined with point defects in said semiconductor substrate and a substance for preventing an impurity providing an electrical conductivity from diffusing on a portion of said one major surface of said semiconductor substrate, said portion being outside of said sidewall and on which a source region and a drain region is to be formed;
    introducing an impurity of one conductivity type into said semiconductor layer by ion implantation; and
    forming said source region and drain region by activating said impurity of one conductivity type and simultaneously diffusing said impurity of one conductivity type into said semiconductor substrate by means of heat treatment.

10. A method of fabricating a semiconductor device having a raised layer as claimed in claim 9, wherein said substance capable of being combined with point defects in said semiconductor substrate is carbon and said substance for preventing an impurity providing an electrical conductivity from diffusing is nitrogen or oxygen.

11. A method of fabricating a semiconductor device as claimed in claim 9, wherein said substance capable of being combined with point defects in said semiconductor substrate and said substance for preventing an impurity providing an electrical conductivity from diffusing is contained in a portion of said semiconductor layer below a surface portion thereof.

12. A method of fabricating a semiconductor device having a raised layer, comprising the steps of:
    forming a gate insulating film on a predetermined region in one major surface of a semiconductor substrate and a gate electrode on said gate insulating film;
    forming a sidewall of an insulating film on a side surface of said gate electrode;
    selectively growing a semiconductor layer containing a substance capable of being combined with point defects in said semiconductor substrate on a portion of said one major surface of said semiconductor substrate, which is outside of said sidewall and on which a source region and a drain region is to be formed, by using a gas containing a reaction gas for selective growth of semiconductor and acetylene;
    introducing an impurity of one conductivity type into said semiconductor layer by ion implantation; and
    forming said source and drain regions by activating said impurity of one conductivity type and simultaneously diffusing said impurity of one conductivity type into said semiconductor substrate by means of heat treatment.

13. A method of fabricating a semiconductor device having a raised layer, comprising the steps of:
    forming a gate insulating film on a predetermined region in one major surface of a semiconductor substrate and a gate electrode on said gate insulating film;

forming a sidewall of an insulating film on a side surface of said gate electrode;

selectively growing a semiconductor layer containing a substance for preventing an impurity providing electrical conductivity from diffusing on a portion of said one major surface of said semiconductor substrate, which is outside of said sidewall and on which a source/drain region is to be formed, by using a gas containing a reaction gas for selective growth of semiconductor and nitrous oxide;

introducing an impurity of one conductivity type into said semiconductor layer by ion implantation; and forming said source region and drain region by activating said impurity of one conductivity type and simultaneously diffusing said impurity of one conductivity type into said semiconductor substrate by means of heat treatment.

14. The method as claimed in claim 1, wherein said selectively grown silicon layer has an upper surface portion with respect to a boundary between said selectively grown silicon layer and said region of said semiconductor substrate and said substance is doped into said selectively grown silicon layer such that said upper surface portion is free from being doped with said substance.

15. The method as claimed in claim 14, further comprising a silicide layer on said upper surface portion of said selectively grown silicon layer.

16. The method as claimed in claim 9, wherein said semiconductor layer has an upper surface portion with respect to a boundary between semiconductor layer and said portion of said one major surface of said semiconductor substrate and said substance is doped into said semiconductor layer such that said upper surface portion is free from being doped with said substance.

17. The method as claimed in claim 16, further comprising a silicide layer on said upper surface portion of said semiconductor layer.

18. The method as claimed in claim 12, wherein said semiconductor layer has an upper surface portion with respect to a boundary between semiconductor layer and said portion of said one major surface of said semiconductor substrate and said substance is doped into said semiconductor layer such that said upper surface portion is free from being doped with said substance.

19. The method as claimed in claim 18, further comprising a silicide layer on said upper surface portion of said semiconductor layer.

20. The method as claimed in claim 13, wherein said semiconductor layer has an upper surface portion with respect to a boundary between semiconductor layer and said portion of said one major surface of said semiconductor substrate and said substance is doped into said semiconductor layer such that said upper surface portion is free from being doped with said substance.

21. The method as claimed in claim 20, further comprising a silicide layer on said upper surface portion of said semiconductor layer.

* * * * *